US012560635B2

(12) United States Patent
Ghanma et al.

(10) Patent No.: US 12,560,635 B2
(45) Date of Patent: Feb. 24, 2026

(54) TEST SYSTEM AND APPARATUS FOR OVER-THE-AIR TESTING OF DEVICES AND ANTENNAS

(71) Applicant: UL LLC, Northbrook, IL (US)

(72) Inventors: Maan Ghanma, Millbrae, CA (US);
Ekta Budhbhatti, San Jose, CA (US);
Barry Klinger, Milpitas, CA (US);
Robert Causey, Gilroy, CA (US)

(73) Assignee: UL LLC, Northbrook, IL (US)

( * ) Notice: Subject to any disclaimer, the term of this patent is extended or adjusted under 35 U.S.C. 154(b) by 245 days.

(21) Appl. No.: 18/242,517

(22) Filed: Sep. 5, 2023

(65) Prior Publication Data

US 2024/0077525 A1 Mar. 7, 2024

Related U.S. Application Data

(60) Provisional application No. 63/403,697, filed on Sep. 2, 2022.

(51) Int. Cl.
G01R 27/28 (2006.01)
G01R 29/08 (2006.01)

(52) U.S. Cl.
CPC ..... G01R 29/0821 (2013.01); G01R 29/0871 (2013.01)

(58) Field of Classification Search
CPC ........................ G01R 29/0821; G01R 29/0871
See application file for complete search history.

(56) References Cited

U.S. PATENT DOCUMENTS

| | | | | |
|---|---|---|---|---|
| 9,906,315 | B1* | 2/2018 | Bartko | H04B 17/0085 |
| 2018/0287721 | A1* | 10/2018 | Vikstedt | H04B 17/0085 |
| 2018/0321292 | A1* | 11/2018 | Bartko | G01R 29/0821 |
| 2018/0340975 | A1* | 11/2018 | Herbrig | G01R 29/0821 |
| 2023/0089785 | A1* | 3/2023 | Lee | G01R 29/0821 |
| | | | | 343/702 |

FOREIGN PATENT DOCUMENTS

| | | | |
|---|---|---|---|
| CN | 113419116 | * | 9/2021 |
| DE | 102021202606 | * | 5/2022 |

* cited by examiner

*Primary Examiner* — Thang X Le
(74) *Attorney, Agent, or Firm* — Greenberg Traurig, LLP

(57) ABSTRACT

A test apparatus includes a test chamber or open area test site configured to receive a device under test and a test fixture located in the test chamber. The test fixture includes at least one fixture antenna. The test apparatus further includes a positioner located within the test chamber. The positioner is configured to support the device under test and rotate the device under test at least 180 degrees about a vertical axis of the test chamber.

16 Claims, 7 Drawing Sheets

TEST SYSTEM AND APPARATUS FOR OVER-THE-AIR TESTING OF DEVICES AND ANTENNAS

CROSS-REFERENCE TO RELATED APPLICATION

This application claims the benefit of and priority to U.S. provisional patent application Ser. No. 63/403,697, filed Sep. 2, 2022, the entire contents of which are hereby incorporated by reference in its entirety.

FIELD OF THE INVENTION

The present description relates generally to a system and apparatus for testing a Device Under Test (DUT), and in particular, for over-the-air (OTA) testing of the commercial capabilities and antenna performance of large DUTs, such as automotive vehicles.

DETAILED DESCRIPTION

Figure 1:
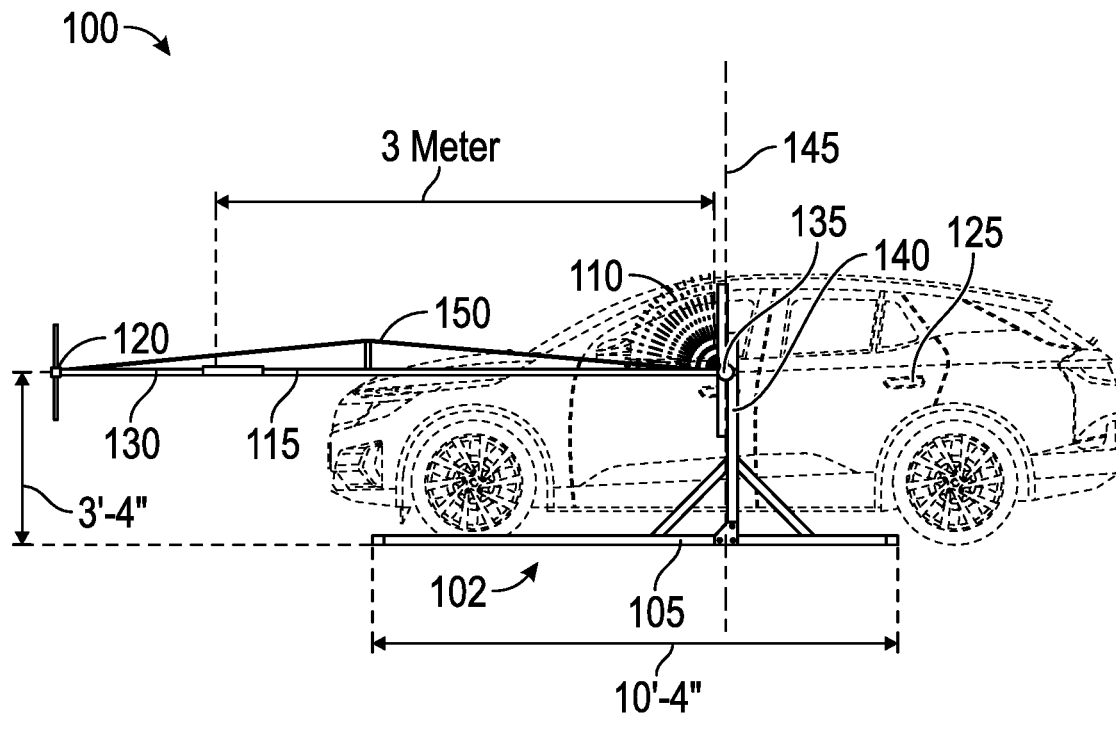
FIG. 1 is a side view of the test system and apparatus, including the test fixture and DUT, in accordance with one or more embodiments.

The following description of example methods and apparatuses is not intended to limit the scope of the description to the precise form or forms detailed herein. Instead the following description is intended to be illustrative so that others may follow its teachings.

Described herein are various embodiments for systems, apparatuses, and methods for testing the communication performance capabilities of a Device Under Test (DUT). For example, various embodiments described herein relate to systems, apparatuses, and methods for measuring the communication performance capabilities of a DUT, such as a vehicle, and specifically for measuring communication performance capabilities such as the vehicle's antenna(s) performance. The systems, apparatuses, and methods described herein may measure multiple communication performance capabilities of a vehicle, such as interoperability performance, radio frequency (RF) performance, electromagnetic compatibility (EMC) performance, and/or electromagnetic interference (EMI). Measuring communication performance capabilities of a Device-Under-Test (DUT) may be useful for design and safety considerations. Failing to consider performance capabilities of DUT in the early stages of product development and throughout product development may result in the time-consuming and costly need to redesign the product at a later stage to meet communication performance standards, rules, requirements and regulations and to prevent product failure and/or a consumer safety risk.

In various embodiments, the test systems, apparatuses, and/or methods may include Over-the-Air (OTA) testing capabilities. Over-the-Air testing may be used to determine whether a Device-Under-Test (DUT) complies with target market requirements, regulations, standards, etc., and/or operates correctly in a quick and cost-effective manner compared to other testing methods. OTA testing may also be used to test various performance characteristics of DUT. The OTA fixtures and testing systems and apparatuses described herein allow for simulating or accurately predicting real-world, or near real-world, performance of a Device-Under-Test, and specifically of the DUT's communication performance capabilities, such as its Wi-Fi, cellular, Bluetooth (RF), GNSS, FM/AM/DAB, etc., performance and capabilities. By using the OTA fixtures and test apparatuses described herein, before production designs of the Device-under-Test products are finalized, designers may potentially avoid costly design issues and unnecessary production delays by testing DUTs early and addressing any product modifications necessary to meet communication capability requirements and other regulatory or non-regulatory requirements earlier in the design process, when discovered using the test apparatuses, systems, and/or methods herein.

In various embodiments, the test system and/or apparatus may be used in an open area test site (OATS) configuration. In other words, a test fixture, turntable, and/or any other components described herein may be used in an open space or area such as outdoors or in a room or building significantly larger than the test system and/or apparatus. As such, in various embodiments, a specific test chamber may not be used.

Figure 5:
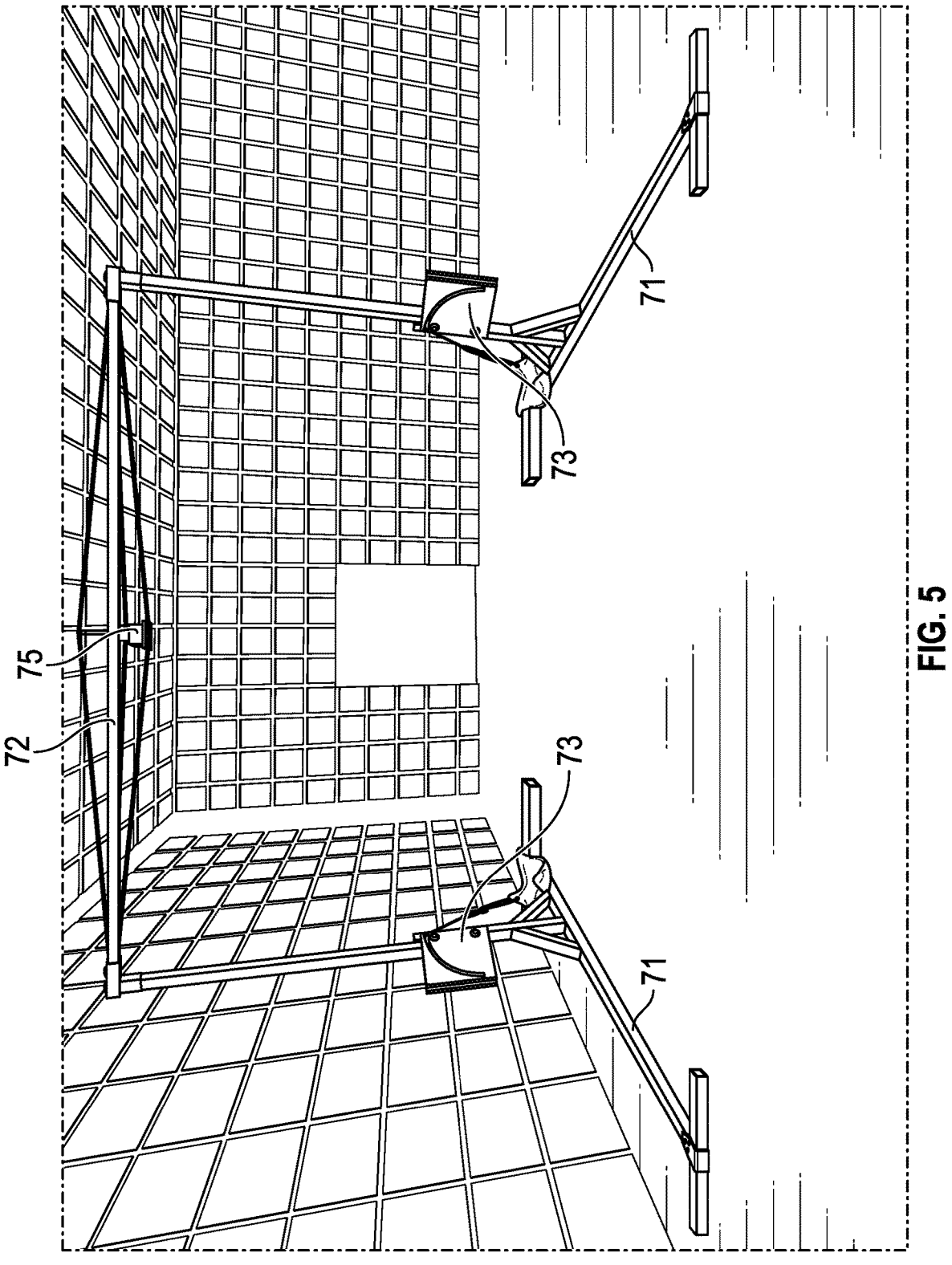
FIG. 5 shows a test system and apparatus, including a 10-meter test chamber and including a test fixture and a positioner inside of the chamber in accordance with one or more embodiments.
Figure 6:
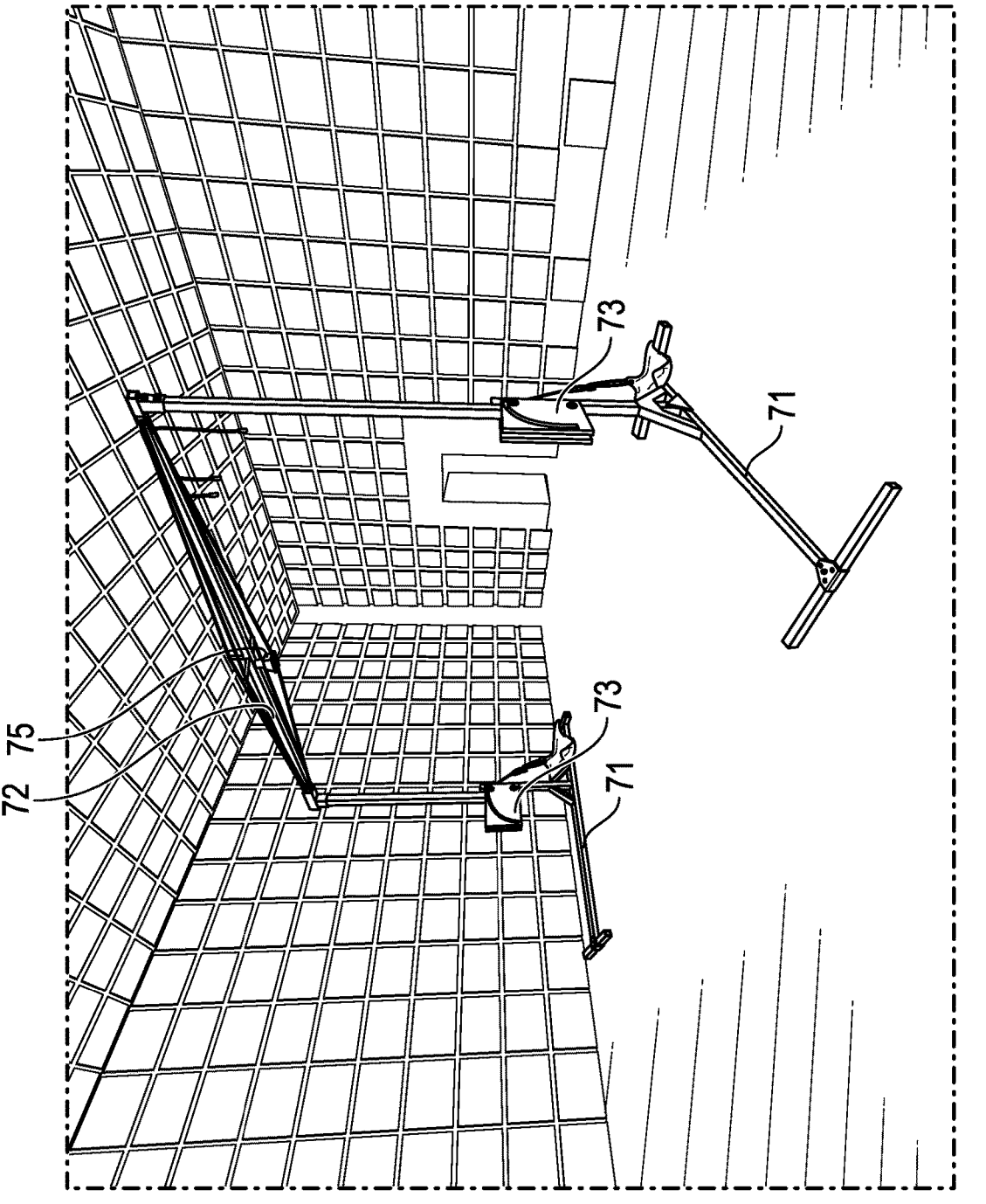
FIG. 6 shows a test system and apparatus, including a 10-meter test chamber and including a test fixture and a positioner inside of the chamber in accordance with one or more embodiments.
Figure 7:
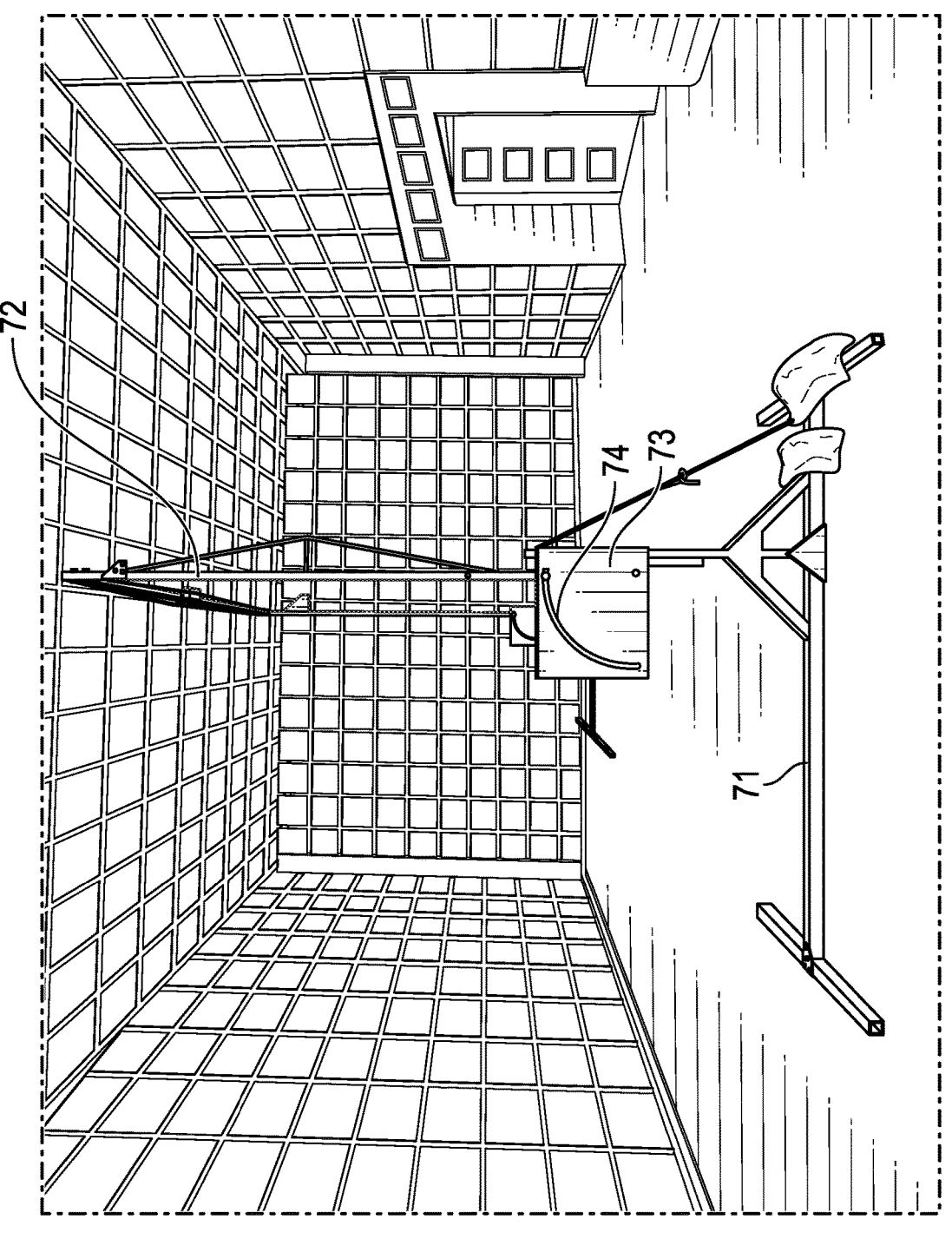
FIG. 7 shows a test system and apparatus, including a 10-meter test chamber and including a test fixture and a positioner inside of the chamber in accordance with one or more embodiments.

In various embodiments, the test system and/or apparatus may include a test chamber, such as a fully anechoic, semi-anechoic, or OTA chamber. Test chambers according to various embodiments of the present description are shown in FIGS. 5-7. The test chamber may include RF shielding material, galvanized steel panels, and/or radiation absorbent material on the walls, ceiling and/or floor. The chamber may also include ferrite tiles and absorbent geometrical materials lining some or all of the inner surfaces of the chamber, to prevent or limit reflection of the electromagnetic field. The chamber may also include hybrid absorbers, such as foam geometrical, pyramidal or wedge absorber panels on top of or with ferrite tiles. As shown in FIGS. 5-7, the radiation absorbent material, ferrite tiles, geometrical foam, absorbent cones and/or hybrid absorbers, etc., may each or in various combinations, be placed over the entire surface area of each surface of the chamber (walls, ceiling and/or floor) and/or, optionally, each or a combination may cover only a portion of one or all of the surfaces. For example, in a semi-anechoic chamber, the walls and ceiling may be fully absorptive or nearly fully absorptive, while the floors may be fully or nearly reflective. Further, as shown in FIGS. 5-7, a portion of the floor may be covered with geometrical absorption foam, to simulate real-world operability (e.g., where there is only partial RF absorption in and EM reflection on the ground). The test chamber may be designed to accommodate large Devices-Under-Test (DUTs). In various examples, the chamber may be a semi-anechoic or OTA chamber and could be a 10-meter chamber. The test chamber may be designed to test large DUTs, such as automotive vehicles. In other embodiments, the chamber may be larger than 10 meter in any direction (including length, width, and height and of the test chamber). Various embodiments may also have a smaller chamber, such as a 3-meter and/or 5-meter semi-anechoic or OTA chamber, for example.

In various embodiments, the test chamber may include a positioner for receiving the test device/DUT. The positioner may be a turntable or rotator, for example, and may be located within the chamber in a known and measurable position, such as in the center or other known locations. The positioner/turntable/rotator may rotate, tilt, and/or pivot the DUT about any desired axis, and/or may be used to shift the DUT vertically and/or horizontally, such that the DUT may be moved within different orientations within the test enclosure. FIGS. 5-7 show an example positioner/turntable that may be used. In one example, the chamber may be of different dimensions, where each of the width, length, and height of the chamber may be anywhere from at least eight (8) meters (m) to at least fifty (50) meters, such as 8 m, 9 m, 10 m, 11 in, 12 in, 13 m, 14 m, 15 m, 16 m, 17 m, 18 m, 19 m, 20 m, 25 m, 30 m, 35 m, 40 in, 45 m, and/or 50 m. As such, the test chamber may be anywhere from 512 cubic meters (m$^3$) to 125,000 m$^3$, or anywhere in between. In examples using open area test sites (OATS), there may be no height or dimensions for the test chamber when a DUT is tested outdoors, or there may be dimensions of a room or building that are very large and negligible with respect to testing a DUT (e.g., a DUT test may be an OATS test in a large room, warehouse, etc. where the room in which the test is performed is much larger than the test fixture and/or turntable itself). Furthermore, a test chamber may be constructed with a different height than the building, ceiling, or roof in which the test is being performed, so in various embodiments a test chamber may have a different height than a height of a ceiling or roof of a building. An example test chamber may have, for example, a width of 10 m and a length of 10 m, and a height defined by a roof of a room or building in which the test chamber is situated. The turntable may also have different dimensions and/or capacities. For example, the turntable may have a capacity of anywhere from one (1) ton (2,000 pounds (lbs)) to 100 tons (200,000 lbs), such as 1 ton, 2 tons, 3 tons, 4 tons, 5 tons, 6 tons, 7 tons, 8 tons, 9 tons, 10 tons, 11 tons, 12 tons, 13 tons, 14 tons, 15 tons, 16 tons, 17 tons, 18 tons, 19 tons, 20 tons, 25 tons, 30 tons, 35 tons, 40 tons, 45 tons, 50 tons, 60 tons, 70 tons, 80 tons, 90 tons, or 100 tons. For example, a capacity of an example turntable may be 13,500 lbs or 6.75 tons. The turntable may also be a 15,000 lbs or 7.5 tons capacity or higher in various embodiments. The turntable may also be round in shape and have a diameter, such as a diameter anywhere between two (2) m and twenty (20) m wide, such as 2 m, 2.5 m, 3 m, 3.5 m, 4 m, 4.5 m, 5 m, 5.5 m, 6 m, 6.5 m, 7 m, 7.5 m, 8 m, 8.5 m, 9 m, 9.5 m, 10 m, 11 m, 12 m, 13 m, 14 m, 15 m, 16 m, 17 m, 18 m, 19 m, or 20 m. The test chamber may also include one or more openings, such as one or more 8 foot by 8 foot door openings, and may further include a grade-level path from an opening in the chamber to the turntable (e.g., so that a vehicle may drive onto or be pushed onto the turntable after passing through or while passing through the opening in the chamber). In various embodiments, a door or opening of the test chamber may be of any desired height or may be size of one of the walls (e.g., where an entire wall is openable as a door or opening to the test chamber). The opening may also have a door, such as garage door, that may be opened and closed to enclose the chamber space while a vehicle or other DUT is inside the chamber. In various embodiments, the DUT may move (drive) or be moved from the opening to the positioner/turntable through opening and over the path.

In various embodiment described herein, the DUT may be an automotive vehicle. The DUT vehicle may include one or more antennas mounted in various locations inside and/or outside of the vehicle body. To test the DUT/vehicle, the vehicle may be driven or moved through the chamber doors, over the path, and onto the DUT positioner/turntable/rotator. The chamber, chamber opening, path, and positioner described herein may accommodate a wide range of vehicle sizes and shapes. For example, the positioner may be a modular and/or adaptable positioner, such that different placement and locking mechanisms may be used to accommodate and secure various vehicles/DUTs in a range of sizes and shapes, including, for example, small vehicles to large SUVs, trucks, semi-trucks, off-road vehicles, military vehicles, and the like. The positioner and test chamber may also accommodate other large electronic devices/DUTs (e.g., DUTs which include more than one antenna for testing, such as drones, personal recreational vehicles, watercrafts (such as boats), large manufacturing or industrial equipment, and the like). In embodiments where the test fixtures described herein are modular, the components of the text fixture may be broken down into multiple pieces to make transportation of the test fixture possible (in the trunk of a car, bed of a pickup truck, etc.). The test fixture may therefore be broken down and re-assembled in different locations to easily perform tests in different locations, in different test chambers, in different locations outdoors, etc.

The chamber may also include high-current alternating current (AC) or direct current (DC) power distribution (e.g., outlets or other power connections) to provide high power capacity for operating DUTs and testing DUTs. It may also include numerous dedicated AC and DC sources for simultaneous use, such as simultaneous high-power testing. The chamber may also include various sensors and monitoring devices for measuring, analyzing and controlling the communication testing parameters and functions.

The test chamber may also include a test fixture, such as an OTA test fixture, for measuring communication performance capabilities, such as radiated performance, active communication performance of the channel(s), antenna pattern(s), interference testing, and interoperability performance. The OTA test fixture may also be modular and adaptable such that the test antennas can be removed or switched out for different antennas depending on the desired test to perform.

Figure 2:
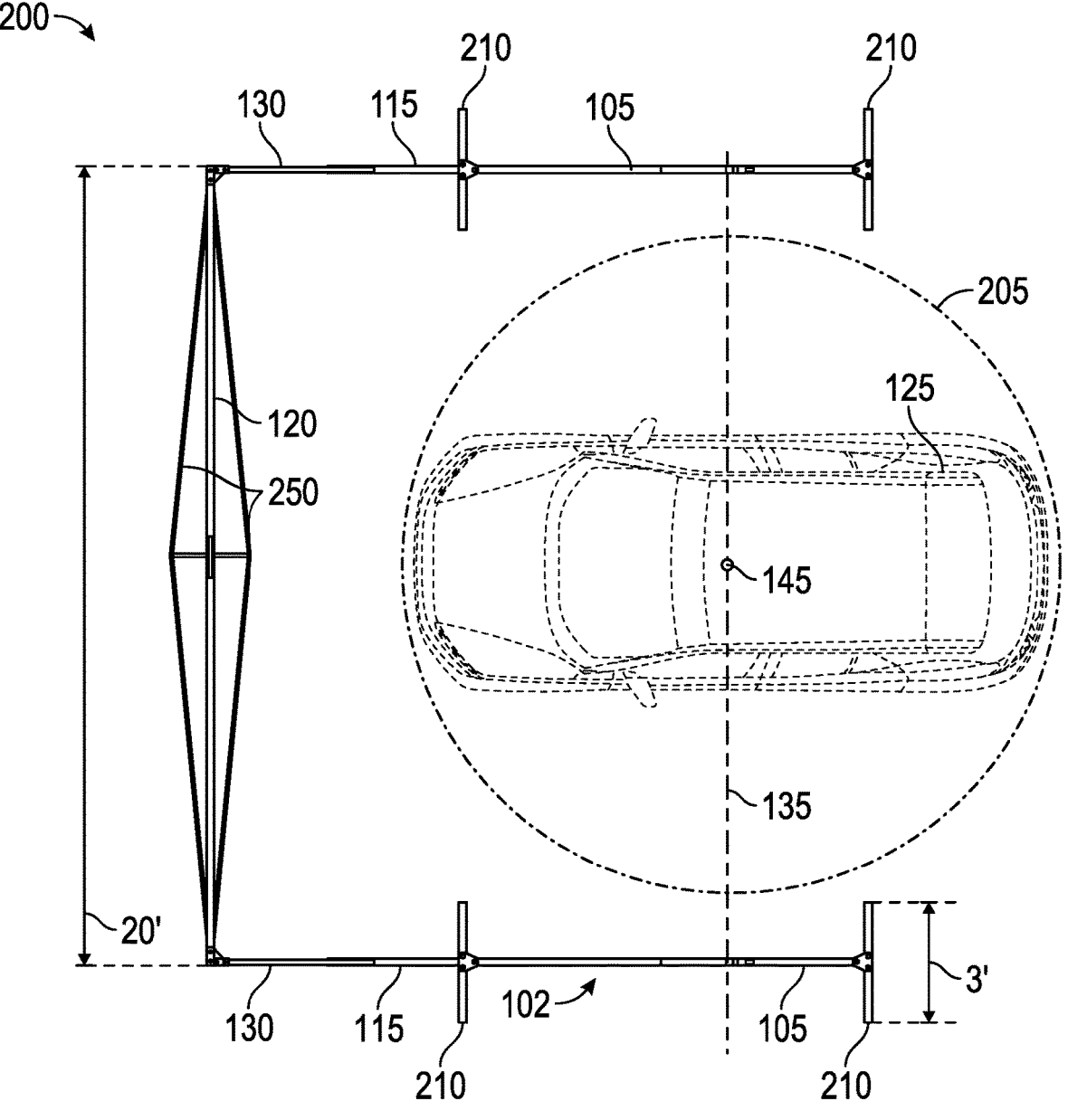
FIG. 2 is a top view of the test system and apparatus, including the test fixture and DUT, in accordance with one or more embodiments.
Figure 3:
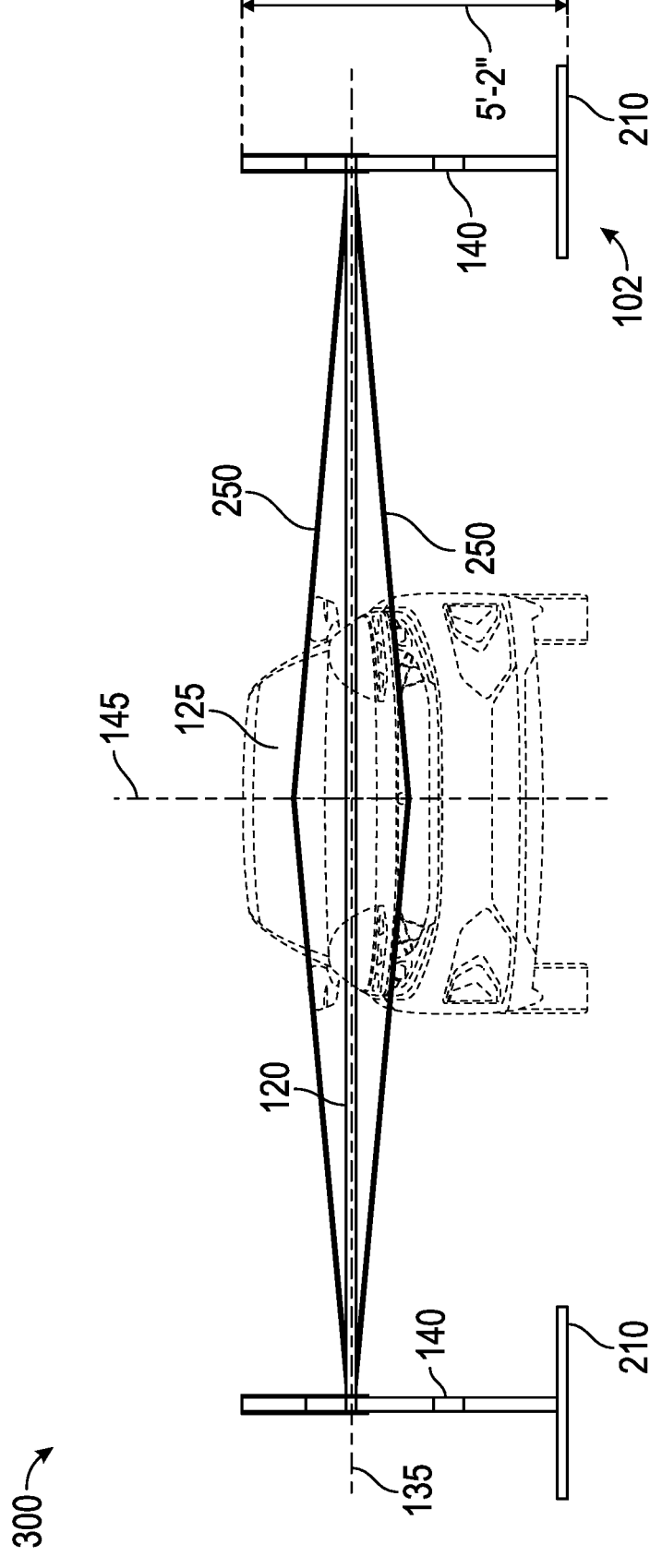
FIG. 3 is a front view of the test system and apparatus, including the test fixture and DUT, in accordance with one or more embodiments.

FIGS. 1-3 show an example test system and apparatus. FIG. 1 shows a side view 100 of the test system and apparatus, including a test fixture 102 and device under test (DUT) 125. FIG. 2 shows a top view 200 of the test system and apparatus, including the test fixture 102 and the DUT 125. FIG. 3 shows a front view 300 of the test system and apparatus, including the test fixture 102 and DUT 125.

The test fixture 102 in particular includes base portions 105 that may rest on a floor of a test chamber and provide support and stability for the rest of the test fixture 102. For example, the base portions 105 may be rigidly connected to vertical stand portions 140. The base portions 105 may be oriented generally horizontally (e.g., parallel with a floor of a test chamber) while the test fixture 102 is in use, and the vertical stand portions 140 may extend from the base portions 105 at a perpendicular angle or normal to the base portions 105. The base portions 105 may have legs 210 that further stabilize and support the test fixture 102, and the legs 210 may extend out at right angles from the base portions 105 such that the legs 210 are perpendicular or normal to the base portions 105.

Arm portions 115 may be connected to the vertical stand portions 140. The arm portions 115 may be connected to the vertical stand portions 140 at an axis 135 such that the arm portions 115 may rotate about the axis 135. The axis 135 may be parallel to a ground or floor upon which the base portions 105 of the test fixture 102 rest, and the axis 135 may further be oriented normal to or perpendicular the base portions 105 that rest on the floor or ground of a test chamber. In various embodiments, the arm portions 115 and assembly that allows the arm portions 115 to rotate about the base portions 105 may be raised and/or lowered with respect to the ground and the base portions 105 (and the vertical stand portions 140), such that the axis 135 is also raised and lowered above the ground. This provides for additional flexibility as to the height and positions achievable by a top portion 120 and any test equipment or antennas attached thereto.

Extension arms 130 may be attached to the arm portions 115 and may be generally parallel to the arm portions 115, acting as extensions of the arm portions 115. The extension arms 130 may move relative to the arm portions 115 so that a top portion 120 of the test fixture 102 may adjust in distance from the axis 135 (e.g., may adjust in distance from the point at which the arm portions 115 rotate about the axis 135 and the vertical stand portions 140). In this way, anything mounted on the top portion 120 to perform a test on the DUT 125 may also be adjusted to different positions with respect to the DUT 125. In various embodiments, cables 150 may be tensioned and attached to the arm portions 115 and/or the extension arms 130 to provide additional stability and rigidity to the arm portions 115 and/or the extension arms 130. In various embodiments, cables 250 may also be tensioned and attached to the top portion 120 to provide additional stability and rigidity to the top portion 120.

As shown in FIGS. 1-3, the base portions 105, the vertical stand portions 140, the arm portions 115, the legs 210, and the extension arms 130 may be located on more than one side of the DUT 125 so that the top portion 120 of the test fixture 102 may extend over various portions of the DUT 125 as the movable portions of the test fixture 102 the arm portions 115, the extension arms 130, the top portion 120) are moved or rotated about the axis 135. In the example of FIGS. 1-3 the base portions 105, the vertical stand portions 140, the arm portions 115, the legs 210, and the extension arms 130 are located on opposing sides of the DUT 125.

A turntable or positioner 205 is further shown, upon which the DUT 125 may be positioned, such as shown in FIG. 2. The positioner 205 may be located in or on the ground or floor of a test chamber (e.g., so that a vehicle may be easily rolled or driven onto the positioner) as described herein. The positioner 205 may rotate about an axis 145 that is perpendicular to or normal to the floor or ground of the test chamber. The axis 145 may further be perpendicular to or normal to the axis 135 about which the arm portions 115, the extension arms 130, and the top portion 120 rotate. In the example of FIGS. 1-3, the axis 145 also intersects the axis 135, though in various embodiments the axis 145 and the axis 135 may not intersect.

In the example of FIGS. 1-3, the test chamber in which the DUT 125 and the test fixture 102 are placed may be a three dimensional space defining or having a horizontal or x axis, a vertical or y axis, and a depth or z axis. In various embodiments, the horizontal or x axis of the test chamber may be generally parallel to the base portions 105 of the test fixture 102 shown in FIGS. 1-3, while being generally normal or perpendicular to axis 135, the axis 145, and the top portion 120. In the position shown in FIGS. 1-3, the arm portions 115 and the extension arms 130 are also generally parallel to the horizontal or x axis of the test chamber. However, the arm portions 115 and the extension arms 130 may rotate as described herein such that the arm portions 115 and the extension arms 130 are no longer generally parallel to the horizontal or x axis of the test chamber.

In various embodiments, the depth or z axis of the test chamber may be generally perpendicular or normal to the ground or floor of the test chamber, the legs 210, and the axis 135. In the position shown in FIGS. 1-3, the top portion 120 is also generally perpendicular or normal to the depth or z axis of the test chamber. However, the top portion 120 may rotate as described herein such that the top portion 120 is no longer generally perpendicular or normal to the depth or z axis of the test chamber. The depth or z axis of the test chamber may also be generally parallel to the axis 145 and the vertical stand portions 140. If the arm portions 115 and the extension arms 130 were rotated ninety (90) degrees clockwise with respect to its position shown in FIG. 1 (e.g., such that the top portion 120 is over the DUT 125), the arm portions 115 and the extension arms 130 would be generally parallel to the depth or z axis of the test chamber as well as the axis 145.

In various embodiments, the vertical or y axis of the test chamber may be generally parallel to the ground or floor of the test chamber, the axis 135, the legs 210, and the top portion. In the position shown in FIGS. 1-3, the top portion 120 is also generally parallel the vertical or y axis of the test chamber and the vertical or y axis is generally normal to or perpendicular to the base portions 105, the arm portions 115, and the extension arms 130. However, even while the arm portions 115 and the extension arms 130 rotate about the axis 135 as described herein, the arm portions 115 and the extension arms 130 may remain generally normal to or perpendicular to the vertical or y axis. Similarly, even while the top portion 120 rotates about the axis 135 as described herein, the top portion 120 may remain generally parallel to the vertical or y axis.

As described herein, portions of the test fixture 102 (e.g., the arm portions 115, the extension arms 130, the top portion 120, any device or object mounted on the top portion 120) may rotate about the axis 135, and the DUT 125 may rotate about the axis 145. As such, various configurations of the DUT 125 and the top portion 120 (and any devices mounted thereon) may be achieved. If the position shown in FIG. 1 shows the arm portions 115, the extension arms 130, the top portion 120, any device or object mounted on the top portion 120 at a ninety (90) degrees position, the arm portions 115, the extension arms 130, the top portion 120, any device or object mounted on the top portion 120 may be rotated clockwise around the axis 135 from the 90 degrees position shown in FIG. 1 anywhere between that 90 degrees position and a zero (0) degrees position where the arm portions are parallel to the axis 145 to achieve different positions for testing the DUT 125. As such, the DUT may be tested with the arms portion 115 and the top portion 120 at various points between the 0 and 90 degrees position, then the DUT may be rotated by the turntable to further test the DUT again using the test fixture at various points between the 0 and 90 degrees positions. As such, the arms portion 115 and the top portion 120 may be positioned anywhere between the 0 and 90 degrees positions at various times during the test (e.g., (e.g., the arms portion may rotated anywhere from the 0 degree position to the 90 degree position, such as the 0 degree position, a 5 degree position, a 10 degree position, a 15 degree position, a 20 degree position, a 25 degree position, a 30 degree position, a 35 degree position, a 40 degree position, a 45 degree position, a 50 degree position, a 55 degree position, a 60 degree position, a 65 degree position, a 70 degree position, a 75 degree position, an 80 degree position, an 85 degree position, and/or the 90 degree position. However, in various embodiments, the arms portion 115 and the top portion 120 may be rotated beyond the 0 and 90 degrees positions. For example, referencing FIG. 1 with the arms portion 115 in the 90 degrees position, the arms portion 115 may further rotate counterclockwise beyond the 90 degree position shown in FIG. 1, in various embodiments (e.g., the arms portion 115 may rotated anywhere from the 90 degree position to approximately a 180 degree position, such as a 95 degree position, a 100 degree position, a 105 degree position, a 110 degree position, a 115 degree position, a 120 degree position, a 125 degree position, a 130 degree position, a 135 degree position, a 140 degree position, a 145 degree position, a 150 degree position, a 155 degree position, a 160 degree position, a 165 degree position, a 170 degree position, a 175 degree position, and/or approximately a 180 degree position).

In various embodiments, the arms portion 115 and the top portion 120 may be further rotated past the 0 to 180 degrees positions (e.g., in embodiments where a turntable may not be used to rotate the DUT). For example, referencing FIG. 1, the arms portion 115 and the top portion 120 may be rotated to any position to the right of the axis 145. The positions to the right of the axis 145 may be referred to as negative degree positions, so the arms portion 115 and the top portion 120 may be rotated in various embodiments to anywhere between the 0 degree position and an approximately 180 degree position on the right side of the axis 145 (e.g., in the negative degree positions) as desired for a given test. For example, the arms portion 115 and the top portion may rotate to the 0 degree position, a −5 degree position, a −10 degree position, a −15 degree position, a −20 degree position, a −25 degree position, a −30 degree position, a −35 degree position, a −40 degree position, a −45 degree position, a −50 degree position, a −55 degree position, a −60 degree position, a −65 degree position, a −70 degree position, a −75 degree position, an −80 degree position, an −85 degree position, a −90 degree position, a −95 degree position, a −100 degree position, a −105 degree position, a −110 degree position, a −115 degree position, a −120 degree position, a −125 degree position, a −130 degree position, a −135 degree position, a −140 degree position, a −145 degree position, a −150 degree position, a −155 degree position, a −160 degree position, a −165 degree position, a −170 degree position, a −175 degree position, and/or approximately a 180 degree position on the negative degree side of the axis 145. further clockwise to a negative ninety (−90) degrees position or further (e.g., greater than −90 degrees, −95 degrees, −100 degrees, −105 degrees, etc.). As such, at both the 90 degrees position and the −90 degrees position the arms portion 115 and the top portion 120 may be parallel with the ground/floor and/or the base portions 105.

In various embodiments, a test fixture may only be permitted and configured to allow a rotation of a portion of the degree positions and ranges described herein. For example, the embodiment of FIGS. 1-3 only permit rotation between the 90 degrees position shown in FIGS. 1-3 to the 0 degrees position (e.g., rotating 90 degrees clockwise from the position shown in FIG. 1, which spans the angles 110 of FIG. 1 shown between the arm portions 115 and the vertical stand portions 140), as the rear half of the DUT 125 may still be tested by rotating the DUT 125 using the positioner 205. In various embodiments, the test fixture 102 may have a locking mechanism to lock the arm portions 115, the extension arms 130, the top portion 120, any device or object mounted on the top portion 120 at any position between and including the 0 and 90 degrees positions (or any other range of degree positions as described herein). The test fixture may also be configured to lock the arms portion 115 and the top portion at different angle positions within the ranges described herein. As such, in various embodiments, the arm portions 115, the extension arms 130, the top portion 120, any device or object mounted on the top portion 120 may be configured to rotate and/or lock within, at, or beyond the 0 and 90 degree positions shown by the angles 110 of FIG. 1. In various embodiments, the movement of the rotatable components may be limited by a construction of the test fixture itself to prevent rotation beyond a desired angle range, or the rotatable components may only be limited, for example, upon hitting or coming into contact with (i) the floor or ground of the test chamber within which the test fixture 102 is placed or located, (ii) the DUT 125 itself, and/or (iii) a platform or other structure that elevates the DUT 125 off the ground or floor.

In various embodiments, a platform or other structure may be set on a turntable (e.g., in embodiments where a turntable is used) and/or on the floor/ground (e.g., in embodiments where a turntable is not used), and the DUT may be placed, mounted, and/or affixed on the platform or other structure to elevate the DUT above the ground or floor or surface of the turntable. Such a platform or structure may have an adjustable height to achieve a desired height or orientation of the DUT. The platform or other elevating structure may permit the arms portion 115 and the top portion 120 of the test fixture 102, for example, to rotate around the sides and bottom of the DUT (e.g., at positions at or near the 90 and/or −90 degree positions all the way to the approximately 180 degree position) because the DUT is elevated off the floor/ground, such that the top portion 120 may move into a space between the DUT and the floor/ground. In this way, the test fixtures described herein may rotate more completely around the DUT in various embodiments as desired. In various embodiments, the turntable itself may also be movable vertically, so that the height of the DUT may be adjusted as desired (with or without the use of a platform on the turntable upon which the DUT may be placed or mounted).

In various embodiments, the test fixture 102 may be permanently and/or rigidly affixed to a floor of a test chamber in which the test fixture 102 is located. In various embodiments, the test fixture may not be affixed to the floor of a test chamber such that the test fixture 102 may be moved about the test chamber. In various embodiments, the test fixture 102 may be temporarily, releasably, or separably fixed to the floor of a test chamber, so that the test fixture 102 may not move unless desired (e.g., the test fixture 102 may not moved if accidentally bumped, but may be moved if a connection to the floor is intentionally removed by an operator of a test). In various embodiments, the test fixture 102 may be on wheels or some other mechanism that makes the test fixture 102 easily movable about and around the DUT whether in a test chamber or an OATS test area. In such examples, the test fixture 102 may therefore be moved to different positions around the DUT. Such a functionality may remove the need for a turntable, in various embodiments.

Figure 4:
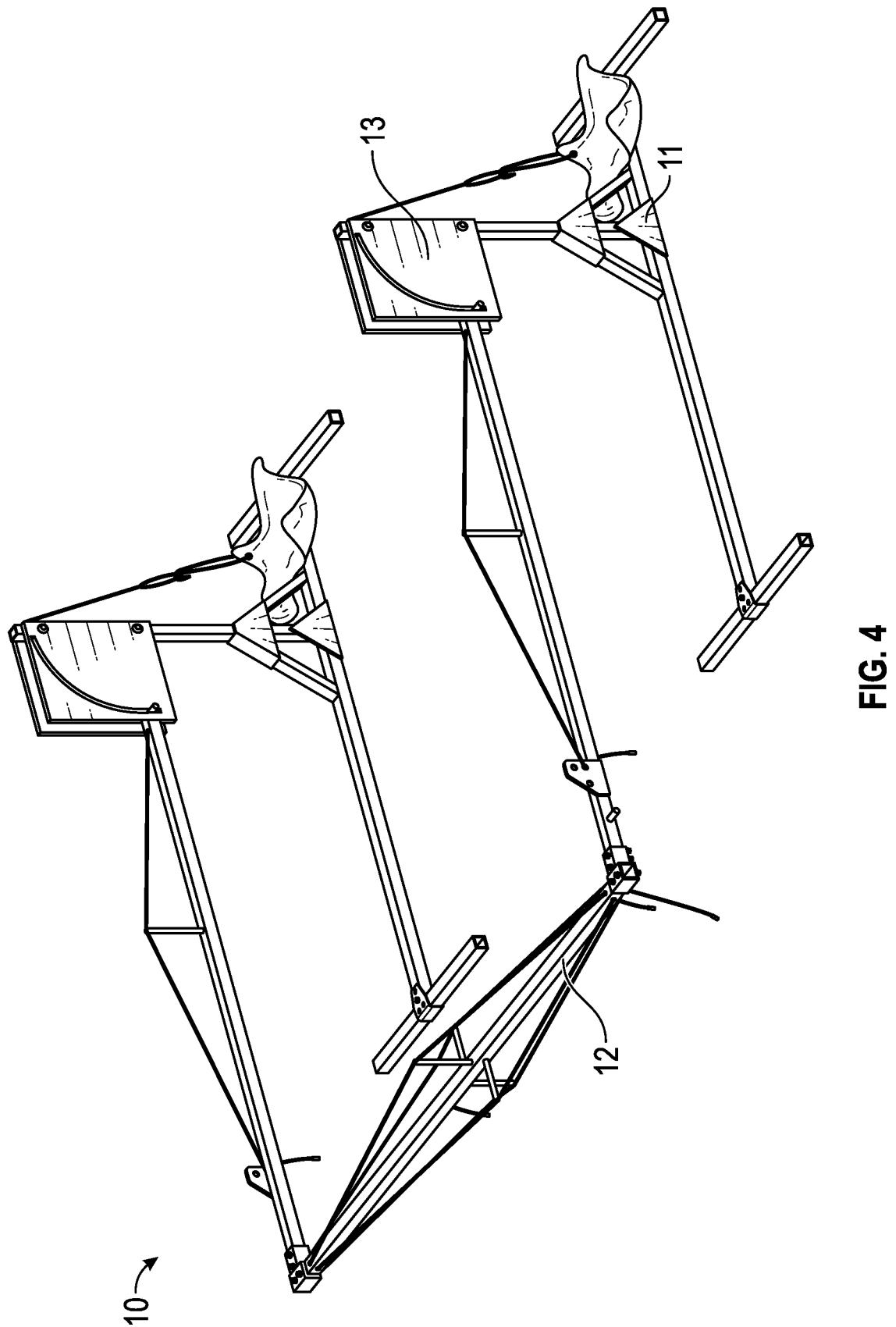
FIG. 4 shows a test fixture in accordance with one or more embodiments.

FIG. 4 shows an example test fixture 10 outside of a test chamber. The test fixture 10 may include a base portion 11, for providing stability and mobility features to the fixture 10. The test fixture may also include additional balancing mechanisms. The test fixture may also include a base or feet portion. For example, the test fixture may include large base portion or feet, that provides a sturdy footprint (particularly as compared to the top of the fixture) for providing stability to the fixture. The test fixture base may also be portable and may include moving mechanisms, such as wheels and locks on the base portion or elsewhere. In this way, the test fixture may be removed easily when the chamber is to be used for a different test, requiring a different test fixture. The test fixture may also be designed to move around the DUT or to or from the DUT, or over the DUT, during testing. The test fixture may also be modular or adaptable to accommodate different DUT sizes or different positioner sizes. For example, the test fixture may be expandable in height and/or width (and retractable).

The test fixture may also include an arm or top portion. As shown in FIG. 4, the test fixture also includes an example top portion 12. The top portion may be designed to hold one or more devices for measuring communication performance capabilities, such as one or more fixture antennas, such as one or more horn antennas. The test fixture may include various different fixture antennas, in place of, or in combination with, the horn antenna as well, including biconical, loop, dipole, etc. Further, the fixture antenna(s) may be located at different locations on the test fixture, such as at the center of the top portion 12, and/or along the sides of top portion 12. The test fixture may also include multiple antennas at once, of the same kind or different kinds, or any combination thereof, depending on the communication capabilities being tested. The fixture antenna(s) may be used for measuring communication performance capabilities, such as RF energy sent or received. The fixture antennas may also transmit or receive signals.

The test fixture may also include a rotating apparatus. For example, as shown in FIG. 4, the test fixture includes a rotating apparatus 13. The test fixture may be rotatable and capable of measuring signals from around the DUT, from, for example, the 0 to 90 degree positions in Theta rotation. The test fixture could also rotate between the 0 degree position to positions beyond the 90 degree position, such as a 105 degree position in the Theta rotation in various embodiments, as for certain DUTs it may be preferable to test with an angle below the horizon (as measured from the horizon of the DUT). For example, where the test fixture rotates to the 105 degree position in the Theta rotation, the test fixture top portion would not be parallel to the ground (as it would be at around the 90 degree position), but, instead, would be the top portion would be closer to the ground/floor. The test fixture could also rotate from the −90 degree position to the 90 degree position in the Theta rotation in various examples as described herein, or, as another example, from the 105 to −90 degree positions or from the 105 degree to −105 degree positions in various embodiments. The test fixture can move by incremental degrees in Theta rotation by any incremental amount desired, for example, 10-degree incremental steps, 5-degree incremental steps, 1-degree incremental steps, etc. The OTA test fixtures described herein may be rotated about the axis manually or automatically (e.g., using a motor), by a desired step increment in the Theta direction. In various embodiments where motors are used to control various aspects described herein, a computer, controller, or processor may be used to execute non-transitory computer readable instructions stored on a computer memory to implement various tests, including moving the turntable and/or test fixture to the desired positions for performing desired tests. In such embodiments, the antenna or other device mounted on the test fixture may also be automatically controlled to take the measurements desired for a given test. For example, the test fixture can be locked at a first angle (such as along a z axis of the test chamber, horizontally along a horizontal axis of the test chamber, or anywhere therebetween), then a first series of test are taken, where the positioner (with a DUT) is rotated for a full turn, such as 360 degrees around the azimuthal angle (e.g., around a vertical axis of the test chamber). In various embodiments, the positioner may be configured to rotated 180 degrees around the azimuthal angle (e.g., around a vertical axis of the test chamber). After the positioner has made a complete rotation or partial rotation, the test apparatus may be turned off and then the test fixture can be repositioned to a new angle, by moving the positioner in a desired incremental step/degree. Once it is moved (e.g. by 5 degree), the test fixture may then be re-secured in place and a next series of test at that angle of measurement may then be performed.

The rotating apparatus 13 of the test fixture may include pegs, such as three pegs, to position and secure the fixture to any desired angle within slots on the test fixture. For example, as shown in FIGS. 5-7, the test fixture includes a base portion 71, a top portion 72, and a rotating apparatus 73. The rotating apparatus 73 further includes slots 74, which allow for manually rotating the fixture between the 0 to 90 degree positions (or, for example, from the 0 to 105 degree positions or the 105 to −105 degree positions) in the Theta rotation, in 5-degree, incremental steps (although other increments may be used in other embodiments). This process may be repeated until a complete 3D analysis of the DUT's antenna performance is gathered and generated. Each cycle of the test from each incremental step move of the test fixture may be saved and combined together to create a 3D map of the complete RF performance analysis around the vehicle. A horn antenna 75 is also shown mounted on the top portion 72 of the test fixture of FIGS. 5-7.

Alternatively, or in addition to the manual movement, the test fixture may also be an automatic, or semi-automatic positioning fixture. The test apparatus may also include programmable hardware and software modules, a controller, such as a programmable logic controller or the like, an interface device, such as a graphical user interface, for inputting desired movements or positions, and the like. It may also include motors and gears for controlling the movement automatically or semi-automatically.

The positioner may have a diameter wide enough to fit an automotive vehicle fully upon the positioner, such as having a diameter of 10 feet or more, 12 feet or more, 14 feet or more, 15 feet or more, 16 feet or more, 18 feet or more, 20 feet or more, 22 feet or more, 24 feet or more, 25 feet or more, 30 feet or more, 40 feet or more, 50 feet or more, 60 feet or more, 70 feet or more, 80 feet or more, or anywhere between 10 and 80 feet. An arm portion (including or excluding an extension arm portions) may be long enough so that the test fixture does not impact the automotive vehicle as the arms are rotated around the automotive vehicle. For example, the arm portion may be 3 feet or more, 5 feet or more, 7 feet or more, 9 feet or more, 10 feet or more, 12 feet or more, 13 feet or more, 14 feet or more, 15 feet or more, 17 feet or more, 20 feet or more, or anywhere between 3 and 20 feet.

The test system and apparatus described herein may measure and analyze a range of communication performance parameters associated with the DUT, such as total radiated power (TRP), total radiated sensitivity (TRS), effective isotropic radiated power (EIRP), effective isotropic sensitivity (EIS), passive antenna performance, cellular desense, WLAN desense, A-GPS sensitivity, intermediate channel degradation (ICD), and/or any combination thereof. The test system and apparatus may measure and/or analyze one, all, or a combination of these communication parameters associated with the DUT.

For antenna performance, the test apparatus may measure and analyze frequencies in the high band (e.g., 6 GHz to 50 GHz, or higher), mid band (e.g., 1 GHz to 6 GHz) and/or low band (e.g., below 1 Ghz). The test apparatuses, systems, and/or methods described herein may also measure communication performance capabilities and interoperability characteristics related to frequencies from 80 GHz to 100 GHz or higher, such as those associated with FM Radio and RADAR.

In a further embodiment, the OTA fixture and test apparatuses, systems, and/or methods may also be used for measuring and analyzing the following DUT communication capabilities: A DUT equipped with Enhanced mobile broadband (eMBB) applications, such as in-vehicle entertainment, virtual and augmented reality, and video surveillance require high bandwidths, (e.g., emBB relevant measurement parameters may include high image resolution (associated with a high bit rate), short time to load (buffer fill), etc.); Massive machine-type communications (mMTC) applications, such as metering, vehicle tracking, and data collection (e.g., mMTC relevant factors may include: the ability to integrate many devices, support high connection density, and optimize battery life, etc.); Ultra-reliable and low-latency communications (uRLLC) applications such as autonomous and/or semi-autonomous driving (e.g., vehicle-to-vehicle and vehicle-to-infrastructure communication) and remote drone piloting (uRLLC, e.g., latency, data transmission timing and delays, etc.); and/or multiple of these and other communication applications in any combination. The test systems, apparatuses, and/or methods described herein may also be used for measuring and analyzing the above communication capabilities and applications in various vehicle and DUT designs.

Although certain example methods and apparatuses have been described herein, the scope of coverage of this patent is not limited thereto. On the contrary, this description covers all methods, apparatus, and articles of manufacture fairly falling within the scope of the appended claims either literally or under the doctrine of equivalents.

What is claimed is:

1. A test apparatus comprising:
a test chamber or open area test site configured to receive a device under test;
a test fixture located in the test chamber, the test fixture comprising at least one fixture antenna; and
a positioner located within the test chamber, wherein the positioner is configured to support the device under test and rotate the device under test at least 180 degrees about a vertical axis of the test chamber,
wherein:
the test chamber further comprises a horizontal axis that is normal to the vertical axis of the test chamber and parallel to a floor of the test chamber;
the test chamber further comprises a depth axis that is normal to both of the vertical axis and the horizontal axis;
the test fixture comprises a rotatable arm configured to rotate about the depth axis of the test chamber;

the rotatable arm comprises a first end located proximal to the depth axis and a second end distal from the depth axis;
an extension arm is connected to the second end of the rotatable arm;
the extension arm is configured to rotate about the depth axis along with the rotatable arm; and
the extension arm is configured to extend or retract relative to the rotatable arm such that the extension arm is configured to move toward or away from the depth axis.

2. The test apparatus of claim 1, wherein the device under test is an automotive vehicle.

3. The test apparatus of claim 1, wherein the device under test is configured to move onto and off of the positioner in a direction generally parallel to the horizontal axis.

4. The test apparatus of claim 1, wherein the at least one fixture antenna is connected to the rotatable arm such that the at least one fixture antenna also rotates about the depth axis.

5. The test apparatus of claim 1, wherein the rotatable arm is configured to rotate at least 85 degrees about the depth axis of the test chamber.

6. The test apparatus of claim 1, wherein the rotatable arm is configured to lock at a plurality of positions about the depth axis of the test chamber.

7. The test apparatus of claim 1, wherein the test fixture further comprises a top portion connected to the extension arm, the top portion extends away from the extension arm in a direction generally parallel to the depth axis, and the at least one fixture antenna is connected to the top portion.

8. A test fixture comprising:
a first base portion configured to rest on a ground or floor;
a first vertical stand portion configured to extend from the first base portion in a direction generally normal to the first base portion;
a first arm portion rotatably attached to the first vertical stand portion, the first arm portion configured to rotate at least 85 degrees with respect to the first vertical stand portion;
a top portion connected to the first arm portion, wherein the top portion is configured for mounting of at least one fixture antenna;
a second base portion configured to rest on the ground or floor;
a second vertical stand portion configured to extend from the second base portion in a direction generally normal to the second base portion; and
a second arm portion rotatably attached to the second vertical stand portion, the second arm portion configured to rotate at least 85 degrees with respect to the second vertical stand portion,
wherein the top portion is connected at a first end to the first arm portion and at a second end to the second arm portion.

9. The test fixture of claim 8, wherein the first arm portion, the second arm portion, and the top portion are configured to rotate together about the first vertical stand portion and the second vertical stand portion.

10. The test fixture of claim 9, wherein the top portion is at least 15 feet long.

11. The test fixture of claim 9, wherein the first arm portion is at least 7 feet long.

12. The test fixture of claim 8, wherein at least one of the first arm portion or the top portion comprises at least one cable tensioned and attached thereto.

13. The test fixture of claim 8, wherein the test fixture is configured for use in a test chamber or an open area test site.

14. A method comprising:

moving a vehicle into a test chamber and onto a positioner in the test chamber;

performing a test on the vehicle or an electronic device of the vehicle using a test device mounted on a test fixture in the test chamber, wherein the performing of the test comprises:

testing a performance of the electronic device at a plurality of positions of the positioner while the test fixture is oriented at a first position; and testing the performance of the electronic device at the plurality of positions of the positioner while the test fixture is oriented at a second position, wherein the test fixture comprises:

a first base portion configured to rest on a ground or floor;

a first vertical stand portion configured to extend from the first base portion in a direction generally normal to the first base portion;

a first arm portion rotatably attached to the first vertical stand portion, the first arm portion configured to rotate at least 85 degrees with respect to the first vertical stand portion;

a top portion connected to the first arm portion, wherein the top portion is configured for mounting of at least one fixture antenna;

a second base portion configured to rest on the ground or floor;

a second vertical stand portion configured to extend from the second base portion in a direction generally normal to the second base portion; and a second arm portion rotatably attached to the second vertical stand portion, the second arm portion configured to rotate at least 85 degrees with respect to the second vertical stand portion, wherein the top portion is connected at a first end to the first arm portion and at a second end to the second arm portion.

15. The method of claim 14, wherein the performing of the test further comprises testing the performance of the electronic device at the plurality of positions of the positioner while the test fixture is oriented at three or more different positions.

16. The method of claim 14, wherein after the performing of the test is complete, the method further comprises moving the vehicle off of the positioner and out of the test chamber.

* * * * *